(12) United States Patent
Griffith et al.

(10) Patent No.: US 6,348,295 B1
(45) Date of Patent: Feb. 19, 2002

(54) METHODS FOR MANUFACTURING ELECTRONIC AND ELECTROMECHANICAL ELEMENTS AND DEVICES BY THIN-FILM DEPOSITION AND IMAGING

(75) Inventors: Saul Griffith, Cambridge; Joseph M. Jacobson, Newton; Scott Manalis, Cambridge, all of MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/519,722

(22) Filed: Mar. 3, 2000

Related U.S. Application Data

(60) Provisional application No. 60/126,517, filed on Mar. 26, 1999.

(51) Int. Cl.[7] .................................................. G03F 7/00
(52) U.S. Cl. ..................... 430/198; 430/311; 430/315; 430/31; 430/545; 427/96; 427/554; 427/559
(58) Field of Search ................................. 430/198, 311, 430/315, 31, 945; 427/96, 554, 559

(56) References Cited

U.S. PATENT DOCUMENTS

| | | | |
|---|---|---|---|
| 4,298,448 A | 11/1981 | Muller et al. | 204/299 |
| 5,066,559 A | 11/1991 | Elmasry et al. | 430/111 |
| 5,380,362 A | 1/1995 | Schubert | 106/493 |
| 5,559,057 A | * 9/1996 | Goldstein | 437/228 |
| 5,587,111 A | 12/1996 | Watanabe et al. | 252/514 |

FOREIGN PATENT DOCUMENTS

WO     WO-97/38810 A1 * 10/1997

OTHER PUBLICATIONS

Guo, et al., "A room-temperature silicon single-electron metal-oxide-semiconductor memory with nanoscale floating-gate and ultranarrow channel," Appl. Phys. Lett. 70(7), pp. 850–852, Feb. 17, 1997.

Zhuang, et al., "Silicon single-electron quantum-dot transistor switch operating at room temperature," Applied Physics Letters, vol. 72, No. 10, pp. 1205–1207, Mar. 9, 1998.

Guo, et al., "Fabrication and characterization of room temperature silicon single electron memory," J. Vac. Sci. Technol. B 15(6), pp. 2840–2843, Nov./Dec. 1997.

Yano, et al., "SA 21.7:A 128 Mb Early Prototype for Gigascale Single–Electron Memories," IEEE International Solid-State Circuits Conference, 1998.

Ishii, et al., "Verify: Key to the Stable Single–Electron–Memory Operation," IEEE, IEDM 97, pp. 171–174, 1997.

Yano, et al., "FP 16.4: Single–Electron–Memory Integrated Circuit for Giga-to-Tera Bit Storage," IEEE International Solid-State Circuits Conference, 1996.

Nakajima, et al., "Room Termperature Operation of Si Single-Electron Memory with Sel-Aligned Floating Dot Gate," IEDM 96, PP. 952–954, 1996.

Tiwari, et al., "Technology and Power-Speed Trade-offs in Quantum-dot and Nano-crystal Memory Devices," Symposium on VLSI Technology Digest of Technical Papers, pp. 133–134, 1997.

Bhyrappa, et al., "Hydrogen–Bonded Porphyrinic Solids: Supramolecular Networks of Octahydroxy Porphyrins," J. Am. Chem. Soc., vol. 119, 8492–8502, 1997.

Zollinger, Color Chemistry, $2^{nd}$ ed., Weinheim, New York, pp. 352–361, 1991.

Murray et al., "Self-Organization of CdSe Nanocrystallites into Three–Dimensional Quantum Dot Superlattices," Science, vol. 270, pp. 1335–1338, Nov. 24, 1995.

Terris, et al., "Near-field optical data storage using a solid immersion lens," Appl. Phys. Lett., vol. 65, No. 4, pp. 388–390, Jul. 25, 1994.

Markovich, et al., "Parallel fabrication and dsingle-electron charging of devices based on ordered, two-dimensional phases of organically functionalized metal nanocrystals," Appl. Phys. Lett. 70 (23), pp. 3170–3109, Jun. 9, 1997.

Yoo et al., "Scanning Single–Electron Transistor Microscopy: Imaging Individual Charges," Science, vol. 276, pp. 579–582, Apr. 25, 1997.

Schoelkopf, et al., "The Radio–Frequency Single–Electron Tansistor (RF–SET): A Fast and Ultrasensitive Electrometer," Science, vol. 280, pp. 1238–1242, May 22, 1998.

Shum, et al., "A concept for nonvolatile memories," Appl. Phys. Lett., 71(17), pp. 2487–2489, Oct. 27, 1997.

Tayaoka, et al., "Preparation of Co–Fe–P amorphous fine needles with anodization technique and measurement of demagnetizing factor," J. Appl. Phys. 79 (8), pp. 6016–6018, Apr. 15, 1996.

(List continued on next page.)

Primary Examiner—John A. McPherson
(74) Attorney, Agent, or Firm—Testa, Hurwitz & Thibeault, LLP

(57) ABSTRACT

Electrically (and, possibly, mechanically) active patterns are applied using a colloidal suspension of nanoparticles that exhibit a desired electrical characteristic. The nanoparticles are surrounded by an insulative shells that may be removed by therefrom by application of energy (e.g., in the form of electromagnetic radiation or heat). The nanoparticle suspension is applied to a surface, forming a layer that is substantially insulative owing to the nanoparticle shells. The applied suspension is exposed to energy to remove the capping groups and fuse the particles into cohesion. If the nanoparticle suspension was deposited as a uniform film, the energy is applied in a desired pattern so that unexposed areas remain insulative while exposed areas exhibit the electrical behavior associated with the nanoparticles. If the nanoparticle suspension was deposited in a desired pattern, it may be uniformly exposed to energy. Additional layers may be applied in the same manner, one over the other, to form a multilayer device.

21 Claims, 2 Drawing Sheets

OTHER PUBLICATIONS

Meier, et al., "Magnetic properties of nanosized wires," *J. Appl. Phys.* 79 (8), pp. 6010–6012, Apr. 15, 1996.

Lafdi, et al., "Cobalt–doped carbon nanotubes: Preparation, texture, and magnetic properties," *J. Appl. Phys.* 79 (8), pp. 6007–6009, Apr. 15, 1996.

Mamin et al., "High–density data storage using proximal probe techniques," *IBM J. Res. Develop.*, vol., 39, No. 6, pp. 618–699, Nov. 6, 1995.

Masumoto, et al., "Room temperature operation of a single electron transistor made by the scanning tunneling microscope nanooxidation process for the $TiO_x$/Ti system," *Appl. Phys. Lett.*, 68 (1), pp. 34–36, Jan. 1, 1996.

Terris, et al., "Data Storage in NOS: Lifetime and Carrier–to–Noise Measurements," *IEEE Tansactions on Elecron Devices*, vol. 42, No. 5, pp. 944–949, May 5, 1995.

Snow, et al., "A metal/oxide tunneling transistor," *Appl. Phys. Lett.*, 73 (23), pp. 3071–3073, Jun. 8, 1998.

Minne, et al., "Automated parallel hich–speed atomic force microscopy," *Appl. Phys. Lett.*, 72 (18), pp. 2340–2342, May 4, 1998.

Celotta, et al., "Nanostructure fabrication via laser–focused atomic deposition (invited)," *J. Appl. Phys.* 79 (8), pp. 6079–6083, Apr. 15, 1996.

Krebs, et al., "Perpendicular transport and magnetic properties in patterned multilayer magnetic microstructures (invited)," *J. Appl. Phys.* 79 (8), pp. 6084–6089, Apr. 15, 1996.

Doudin, et al., "Arrays of multilayered nanowires (invited)," *J. Appl. Phys.* 79 (8), pp. 60909–6094, Apr. 15, 1996.

Gadetsky, et al., "Magneto–optical recording on patterned substrates (invited)," *J. Appl. Phys.* 79 (8), pp. 5687–5692, Apr. 15, 1996.

Bessho, et al., "Fabricating nanoscale magnetic mounds using a scanning probe microscope," *J. Appl. Phys.* 79 (8), pp. 5057–5059, Apr. 15, 1996.

Leslie–Pelecky, et al., "Self–stabilized magnetic colloids: Ultrafine CO particles in polymers," *J. Appl. Phys.* 79 (8), pp. 5312–5314, Apr. 15, 1996.

Johnson, et al., "Finite size effects in nanoscale Tb particles," *J. Appl. Phys.* 79 (8), pp. 5299–5301, Apr. 15, 1996.

Levy, et al., "Femtosecond near–field spin microscopy in digital magnetic heterostructures (invited)," *J. Appl. Phys.* 79 (8), pp. 6095–6100, April 15, 1996.

Chou et al., "65 Gbits/in.2 quantum maganetic disk (abstract)," *J. Appl. Phys.* 79 (8), p. 5066, Apr. 15, 1996.

Chou et al., "Nanolithographically defined magnetic structures and quantum magnetic disk (invited)," *J. Appl. Phys.* 79 (8), pp. 6101–6106, Apr. 15, 1996.

Alivisatos, "Electrical Studies of Semiconductor–Nanocrystal Colloids," *MRS Bulletin*, pp. 18–23, Feb. 1998.

Xia et al., "Soft Lithography," Angew. Chem. Int. Ed., vol. 37, pp. 551–575, 1998.

Rosa, et al., "Direct patterning of surface quantum wells with an atomic force microscope," *Appl. Phys. Lett.*, 73 (18), pp. 2684–2686, Nov. 2, 1998.

\* cited by examiner

METHODS FOR MANUFACTURING ELECTRONIC AND ELECTROMECHANICAL ELEMENTS AND DEVICES BY THIN-FILM DEPOSITION AND IMAGING

PRIOR APPLICATION

This application stems from U.S. Provisional Application Ser. No. 60/126,517, filed on Mar. 26, 1999.

FIELD OF THE INVENTION

The present invention relates to fabrication of electronic and electromechanical devices, and in particular to fabrication of such devices by controlled particle deposition and patterning.

BACKGROUND OF THE INVENTION

Electronic and electromechanical components are presently fabricated in large, immobile manufacturing facilities that are tremendously expensive to build and operate. For example, semiconductor device fabrication generally requires specialized microlithography and chemical etching equipment, as well as extensive measures to avoid process contamination.

The large up-front investment required for manufacturing capacity not only limits its general availability, but also increases the cost of custom fabrication. For a small custom order to be financially competitive with mass production of an established device, the per-unit cost will necessarily be quite high—often out of reach for many designers. Currently, the economics of device fabrication disfavors sophistication and small batch sizes.

In addition to their expense, the fabrication processes ordinarily employed to create electronic and electromechanical components involve harsh conditions such as high temperatures and/or caustic chemicals, limiting the ability to integrate their manufacture with that of functionally related but environmentally sensitive elements. For example, the high temperatures used in silicon processing may prevent three-dimensional fabrication and large-area fabrication; these temperatures are also incompatible with heat-sensitive materials such as organic and biological molecules. High temperatures also preclude fabrication on substrates such as conventional flexible plastics, which offer widespread availability and low cost.

These fabrication processes are also subtractive, depositing a desired material over an entire substrate before removing it from undesired locations through techniques such as etching and lift-off. Subtractive processes are wasteful; introduce dangerous, costly, and environmentally unfriendly chemicals to the fabrication process; and limit the range of manufacturable devices since the etch chemistry can interact with previously deposited layers.

Despite intensive effort to develop alternatives to these processes, no truly feasible techniques have yet emerged. U.S. Pat. No. 5,817,550, for example, describes a low-temperature roll-to-roll process for creating thin-film transistors on plastic substrates. This approach faces numerous technical hurdles, and does not substantially reduce the large cost and complexity associated with conventional photolithography and etching processes.

U.S. Pat. No. 5,772,905 describes a process called "nanoimprint lithography" that utilizes a silicon mold, which is pressed under high pressure and temperature into a thin film of material. Following cooling with the mold in place, the material accurately retains the features of the mold. The thin film may then be treated to remove the small amount of material remaining in the embossed areas. Thus patterned, the film may be used as a mask for selectively etching underlying layers of functional materials. This process is capable of producing patterns with very fine resolutions at costs significantly below those associated with conventional processes. But it is quite complicated, requiring numerous time-consuming steps to create a single layer of patterned functional material. The technique requires high application pressures and temperatures at very low ambient pressures, thereby imposing significant complexity with attendant restriction on the types of materials that can be patterned. Perhaps most importantly, this technique is limited to producing single-layer features, thereby significantly limiting its applicability to device fabrication.

U.S. Pat. No. 5,900,160 describes the use of an elastomeric stamp to mold functional materials. In particular, the stamp is deformed so as to print a self-assembled molecular monolayer on a surface. This process, also called MIMIC (Micromolding Against Elastomeric Masters), is significantly simpler than nanoimprint lithography, and can be performed at ambient temperatures and pressures. But the technique is generally limited to low-resolution features (in excess of 10 $\mu$m), and more importantly, the types of geometries amenable to molding by this technique are limited.

DESCRIPTION OF THE INVENTION

BRIEF SUMMARY OF THE INVENTION

In accordance with the present invention, an electrically (and, possibly, mechanically) active pattern is applied using a colloidal suspension of nanoparticles that exhibit a desired electrical and/or mechanical characteristic. The nanoparticles are surrounded by an insulative shells that may be removed by therefrom by application of energy (e.g., in the form of electromagnetic radiation or heat). The nanoparticle suspension is applied to a substrate (or to a layer previously formed in accordance herewith), forming a layer that is substantially insulative owing to the nanoparticle shells. The layer may be in the form of a continuous planar film or may instead assume a desired pattern.

The applied suspension is exposed to energy to remove the capping groups and fuse the particles into cohesion. If the nanoparticle suspension was deposited as a uniform film, the energy is applied in a desired pattern so that unexposed areas remain insulative while exposed areas exhibit the electrical behavior associated with the nanoparticles. If the nanoparticle suspension was deposited in a desired pattern, it may be uniformly exposed to energy. Additional layers may be applied in the same manner, one over the other, to form a multilayer device.

The nanoparticle suspension may be applied by any of numerous suitable techniques. Spin coating may be used to form a uniform film of the suspension, while ejection (e.g., ink-jet), transfer techniques, or electrostatic patterning can be used to create patterns. Moreover, various techniques may be used to deliver energy to the deposited suspension.

BRIEF DESCRIPTION OF THE DRAWINGS

The foregoing discussion will be understood more readily from the following detailed description of the invention, when taken in conjunction with the accompanying drawings, in which.

DETAILED DESCRIPTION OF THE PREFERRED EMBODIMENTS

Figure 1:
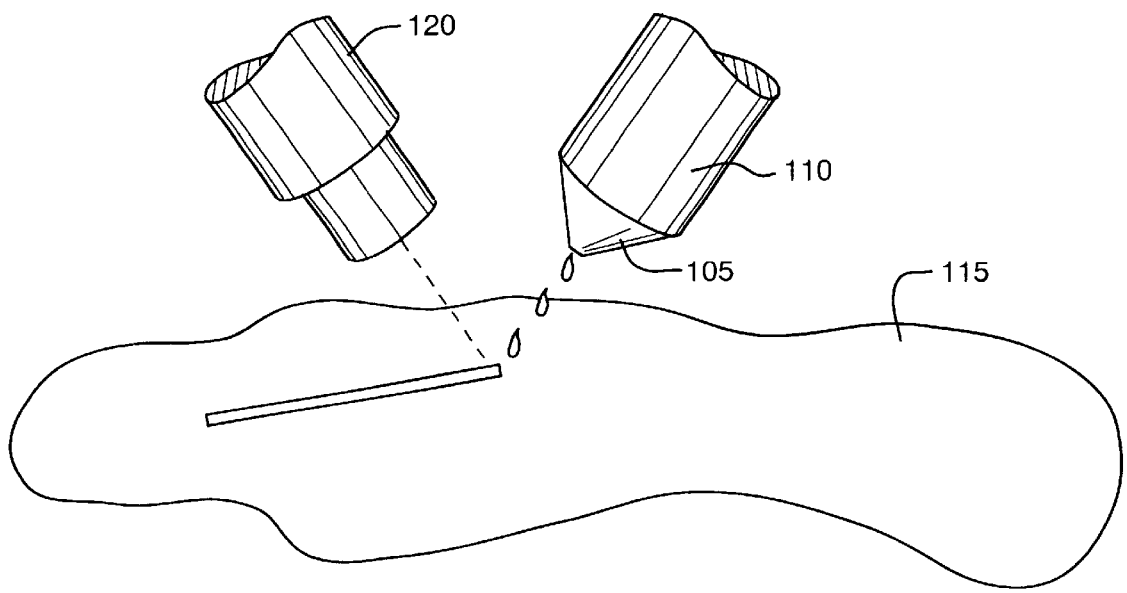
FIG. 1 schematically illustrates a deposition system in accordance with the present invention.

In accordance with the present invention, nanoparticles having desired electrical characteristics are encapsulated within a capping group that is insulative, i.e., physically contains the electrical characteristic and prevents interaction with neighboring particles. The capping material may be removed by application of energy. As used herein, the term "nanoparticles" refers to particles ranging in size from nearly 1 nm to 999 nm. The nanoparticles may be inherently conductive (e.g., gold or silver, see U.S. Pat. No. 5,756,197, the entire disclosure of which is hereby incorporated by reference) or semiconductive (e.g., silicon, germanium, CdSe, CdTe, etc., see U.S. Pat. No. 5,534,056, the entire disclosure of which is hereby incorporated by reference). Nanoparticle synthesis is well known and described, for example, in Alivisatos, "Electrical Studies of Semiconductor-Nanocrystal Colloids," MRS Bulletin, February 1998, at 18–23.

The capping groups may surround the particles as a tangle of minute threads or as a complete shell. Desirably, the capping groups have resistivities of $10^9$ Ω-cm or more. In one approach, the capping group is a wax, and may be applied to nanoparticles as described in U.S. Pat. No. 4,298,448, the entire disclosure of which is hereby incorporated by reference. In particular, the wax is dissolved at elevated temperature in a liquid carrier in which the wax is poorly soluble at lower temperatures. The nanoparticles are added and the temperature is lowered. The nanoparticles serve as nucleation sites, and are removed from the working medium when the shells have reached a desired thickness.

In another approach, the capping groups comprise molecules having hydrocarbon chains that confer insulative properties. One end of the molecule adsorbs onto the nanoparticle surfaces while the other end remains free, resulting in a wool-like coating around the particles that provides effective insulation. For example, the surfaces of the nanoparticles may contain acidic surface sites, in which case the capping-group molecule may contain a basic (e.g., amine) terminal group. An exemplary capping group for this purpose is the amine-terminated OLOA 1200 material supplied by Chevron and described in U.S. Pat. No. 5,380,362, the entire disclosure of which is hereby incorporated by reference. This material is a polybutylene succinimide with a basic anchoring group and a 50 Å extended hydrocarbon chain. Other exemplary capping groups for nanoparticles with acidic surface sites include various polyvinylpyridine block copolymers. Naturally, if the nanoparticle exhibits basic surface sites, hydrocarbon chains with terminal acidic (e.g., carboxyl) groups are instead employed. Another useful capping group of this type is dodecanethiol; when added, for example, to silver nanoparticles, reverse micelles are formed due to attraction of the thiol group for the nanoparticle. Still other capping groups include lauryl betaine and cocoylamidopropyidimethylaminoacetic acid betaine. See, e.g., U.S. Pat. No. 5,587,111.

In some embodiments, the capping groups, while insulative with respect to the particles, nonetheless exhibit an overall surface charge (i.e., a zeta potential) that assists with patterning. In these embodiments, the capping groups may be derivatives of maleic acid, succinic acid, diisobutylene, benzoic acid, fumaric acid, acrylic acid, methacrylic acid and the like, or metal soaps; see U.S. Pat. No. 5,066,559 (the entire disclosure of which is hereby incorporated by reference). These capping groups comprise a moiety that binds to the nanoparticle surface, a charge moiety, and an intervening hydrocarbon chain. The hydrocarbon chain effectively insulates the interior from the charge and from the electrical activity of surrounding particles.

In accordance with the invention, nanoparticles are applied as a suspension to a surface that is, preferably, relatively smooth. Useful carrier liquids for nanoparticle suspensions include α-terpinol (for metal nanoparticles) and pyridine (for semiconductive nanoparticles). Suitable substrates include glass slides, metal, and silicon wafers. In one approach, the suspension is applied uniformly so as to form a thin, evenly surfaced film. This may be accomplished, for example, by spin coating. With this approach, the nanoparticle suspension is applied in bulk to the substrate, preferably at or near the center. The substrate is spun at high speed (1000–8000 RPM or higher) to form a uniform film ranging in thickness from 20 nm to several microns.

Alternatively, a modified "pull-down bar" mechanism can be used to deposit these thin films. In this technique a flat rod or wedge is bought into close proximity to the surface to be covered, and then passed over the surface with a pool of the nanoparticle suspension disposed on the side of the direction of travel. The result is formation of a thin film on the trailing side of the bar.

The deposited film may then be exposed, in accordance with a desired pattern, to energy that will detach (and, possibly, decompose) the capping groups and also fuse the particles into a continuous material that possesses, in bulk, the electrical property for which the particles are chosen. This process is referred to herein as "sintering." In this regard, it should be noted that nanoparticulate materials exhibit depressed melting points relative to the bulk material, so that the processing temperatures for these materials are lower than those of the bulk material. In this way, temperature-sensitive substrates can be combined with electrical materials that ordinarily require incompatibly high processing temperatures.

In one approach, the output of one or more lasers is used to selectively fuse the deposited nanoparticle material. Laser output can be provided directly to the film surface via lenses or other beam-guiding components, or transmitted thereto using a fiber-optic cable. It can also be applied in parallel through a controlled array of micromirrors. A controller and associated positioning hardware maintains the beam output (s) beam output at a precise orientation with respect to the surface, scans the output thereover, and activates the laser at positions adjacent selected points or areas of the deposited nanoparticle material. The controller responds to image signals corresponding to the desired patterns, and which may be stored as a bitmap data file or other CAD (computer aided design) file source on a computer. See, e.g., U.S. Pat. No. 5,385,092. Alternatively, light-valving approaches may be employed.

The optimal wavelength of the laser is determined by the nature of the nanoparticle material and the desired feature size of the pattern. The greater the inherent absorptivity of the particles for laser radiation, the greater will be the operating efficiency—i.e., sintering will take place at lower working power levels. Accordingly, it is useful to match the $\lambda_{max}$ of the laser to the particles' intrinsic absorptivity. The laser wavelength also determines the minimum obtainable feature size, so short wavelengths (corresponding to higher energies) are preferred.

For example, coherent infrared (IR) radiation at 1064 nm can be used to transform silver or gold nanocrystals (in solution or as a dry film) into conducting lines of silver or gold. It is also possible to use ultraviolet (UV) radiation to remove the capping groups and fuse the nanocrystals. The UV energy can be sufficient to completely remove the capping groups and fuse the material, or can instead merely alter the state of the capping groups and bind the exposed nanocrystals sufficiently to withstand a solvent wash. Following removal of unexposed nanocrystals by such a wash, the remaining (exposed) crystals can be exposed to a thermal treatment that removes any remaining organic groups and fully sinters the crystals into continuity.

Alternatives to laser exposure are of course possible. For example, the film may be patterned by exposure to electromagnetic radiation through a photomask, which permits the radiation to pass only in accordance with the desired pattern. Once again, the wavelength and intensity of the radiation source are chosen based on the responsiveness of the material to be patterned; in this case, the minimum feature size is limited primarily by diffraction. Another exposure technique involves directed application of thermal energy, e.g., by means of a scanning thermal tip or a substrate heated in accordance with the desired pattern. An electron beam source at the tip of a scanned cantilever (similar to an atomic-force microscope cantilever) is one example of this approach.

Either before or after the fusing step, the deposited material may be dried of the carrier liquid to create a continuous, hard film. Following patterning, the unexposed areas will remain electrically insulative, since removal of the the carrier does not affect the integrity of the capping groups. Drying may be accomplished simply by exposure to ambient conditions, by moderate heating, or by exposure to vacuum. Alternatively, areas of the applied nanoparticle suspension that have not been fused can be removed from the substrate using a solvent (e.g., butanol, terpinol, ethanol, or combinations thereof).

Retaining the unexposed film portions may be preferred for applications involving more than a single layer, because the fused and unfused areas form a substantially planar support surface upon which an overlying layer can be deposited. Fused particles of adjacent layers interact electrically where they come into contact. Moreover, it is possible to tune an energy source such as a laser to affect only a single layer (generally the top layer) in a stratified series. For example, laser radiation may be directed with a very small depth of focus so that the fluence below the surface layer is too small to cause sintering to take place. Absorption of laser radiation and retention of heat by the topmost layer also serve to protect underlying layers during imaging.

In some applications, however, surface topography is desired. This is particularly true for multilayer devices in which different layers must intercommunicate with non-adjacent layers. Non-uniform surface topographies are readily achieved by applying the nanoparticle suspension by displacement rather than by coating. As used herein, the term "displacement" refers to deposition processes that permit application of the nanoparticle suspension in a discrete fashion to selected areas of a surface; such processes include ejection techniques such ink-jet and related technologies, as well as transfer approaches such as stamping and microcontact printing. An exemplary arrangement for deposition by ejection and subsequent sintering is shown in FIG. 1. An ejection nozzle 105 is in fluid communication with a supply of the nanoparticle suspension 110. Nozzle 105 is scanned over the surface of a substrate (or previously deposited layer) 115, and is selectably actuated by a controller (not shown) when adjacent to locations at which deposition is appropriate. A laser 120, which may be mounted with nozzle 105 on a common writing head, sinters the deposited nanoparticle suspension just after its deposition.

In practice, a working system will typically involve multiple nozzle arrangements, each supplying a different nanoparticle suspension which, when sintered, provides a different electrical characteristic. In this way, different suspensions can be applied within a single layer, providing a greater diversity of available electrical characteristics. Moreover, the topology of the layer can be varied so as to permit contact with non-adjacent layers.

Figure 2:
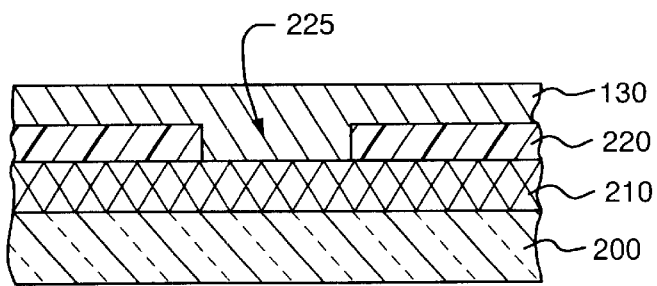
FIG. 2 is a sectional view illustrating a multilayer construction with a via fabricated in accordance with the present invention.

One example of this is shown in FIG. 2. A substrate 200 carries a first layer 210 having a smooth, even topology. Over layer 210 is applied a second layer 220, which has a gap 225 (where material was not deposited) that exposes the underlying layer 210. A third smooth layer 230 is applied at sufficient thickness to fill the gap 225 and still provide a substantially planar surface 230s, thereby affording contact between layers 230 and 210. Gap 225, in other words, acts as a "via" between layers 210, 230.

Figure 3:
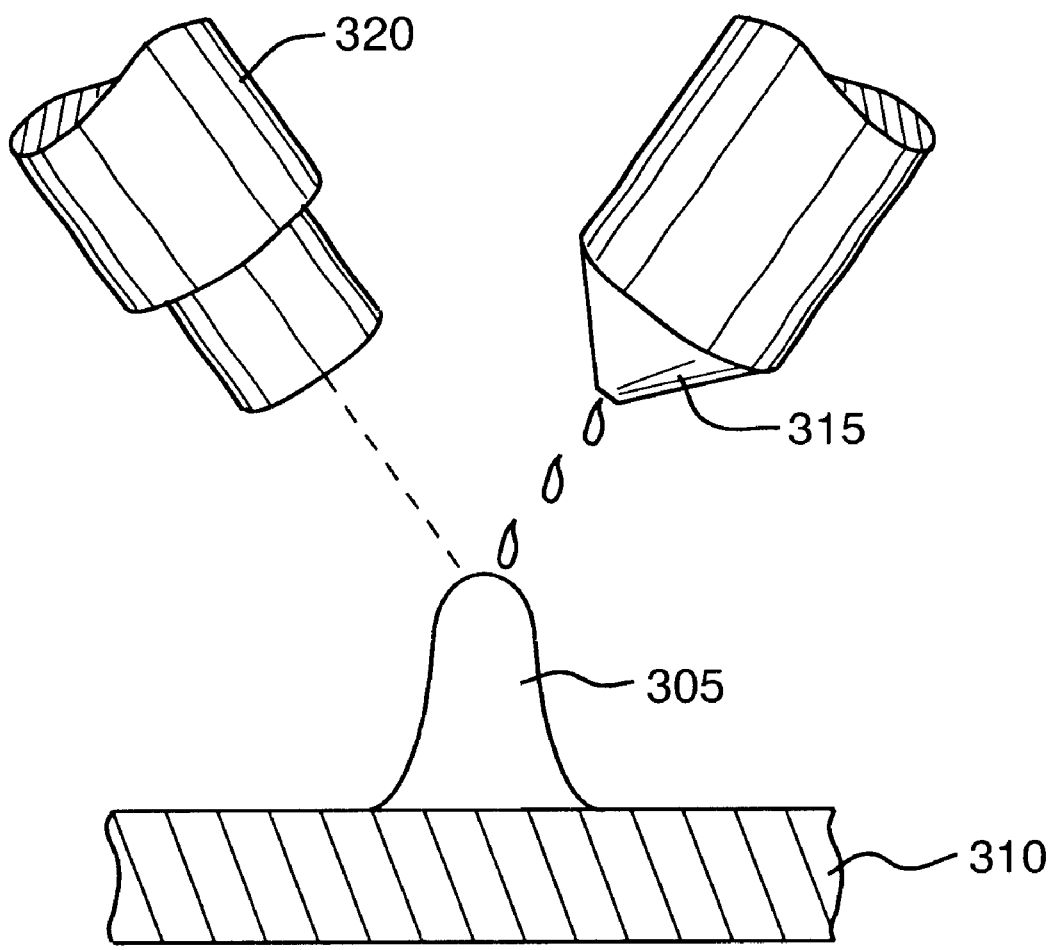
FIG. 3 schematically illustrates the creation of surface features using a deposition process.

Another example of uneven surface topography that facilitates inter-layer contact is shown in FIG. 3. Instead of a via, a projection 305 is deposited onto a substrate (or previously deposited layer) 310. A nozzle 3 continuously ejects droplets that are immediately sintered into solidity by a laser 320. Projection 305 can span one or more subsequently deposited layers, facilitating their electrical communication with layer 310. An advantage to this approach is the ability to use a material for projection 305 that differs from any of the layers it traverses.

The distribution of the nanoparticle suspension on a substrate can also be established by electrostatic patterning in a manner analogous to conventional electrophotography. If the capping groups have charged moieties at their free ends, as discussed above, then each capped nanoparticle will exhibit an overall surface charge. A complementary electrostatic charge may be deposited in a desired pattern onto a suitable dielectric substrate (or previously deposited layer) using conventional electrophotographic equipment. The capped nanoparticles, either in a dry state or in suspension, are then applied to the charged substrate. Particles not immobilized by the charge are removed (e.g., by means of a solvent wash as discussed above). The entire substrate may then be exposed to energy (in the form of electromagnetic radiation or heat) to sinter the already-patterned nanoparticles.

It should be stressed that the present invention is useful not only in the fabrication of purely electronic devices, but also microelectromechanical (MEM) devices. That is, the different layers of a multilayer construction may implement mechanical functions mediated, for example, by the electrical characteristics of the device.

Although the present invention has been described with reference to specific details, it is not intended that such details should be regarded as limitations upon the scope of the invention, except as and to the extent that they are included in the accompanying claims.

What is claimed is:

1. A method of creating an electrically active pattern, the method comprising the steps of:

a. providing a colloidal suspension of nanoparticles, the nanoparticles exhibiting a desired electrical characteristic and being surrounded by an insulative shell;

b. applying the suspension to a substrate as a continuous film, the applied suspension being substantially insulative owing to the nanoparticle shells; and c. exposing the applied suspension to energy in a desired pattern, the energy removing the shells from the nanoparticles and fusing the nanoparticles together, thereby causing exposed portions of the applied suspension to exhibit the electrical characteristic.

2. The method of claim 1 wherein the applied suspension is spin-coated to produce a uniform film.

3. The method of claim 1 further comprising the step of applying a second suspension of nanoparticles over the film and exposing the applied second suspension to energy in a desired pattern, the energy removing the shells from the nanoparticles of the second suspension and fusing them together without damaging the underlying film.

4. The method of claim 3 wherein the nanoparticles of the second suspension have an electrical characteristic different from the nanoparticles of the underlying film.

5. The method of claim 3 further comprising repeating the application and exposing steps to form a plurality of additional contiguous layers.

6. The method of claim 1 wherein the suspension is applied to the substrate in a pattern by displacement.

7. The method of claim 6 wherein the displacement is performed so as to apply the suspension to the substrate in a substantially planar pattern.

8. The method of claim 7 further comprising the steps of again performing the displacement so as to apply a second suspension onto the previously applied pattern and exposing the applied second suspension to energy in a desired pattern, the energy removing the shells from the nanoparticles of the second suspension and fusing them together without affecting the underlying pattern.

9. The method of claim 6 wherein the displacement is performed so as to produce a first layer with projecting features; a second layer over the first layer, the first layer projections penetrating the second layer; and a third layer over the second layer in contact with the first-layer projections.

10. The method of claim 6 wherein the displacement is performed so as to produce a first layer; a second layer over the first layer, the second layer having gaps therein; and a third layer over the second layer in contact with the first layer through the second-layer gaps.

11. The method of claim 6 wherein the displacement is performed with a plurality of suspensions different materials to form a patterned layer thereof on the substrate.

12. The method of claim 1 wherein the nanoparticles are conductive.

13. The method of claim 1 wherein the nanoparticles are semiconductive.

14. The method of claim 1 wherein the energy is in the form of electromagnetic radiation.

15. The method of claim 14 wherein the energy is provided by a laser.

16. The method of claim 1 wherein the energy is thermal.

17. The method of claim 1 wherein the nanoparticles consist of a chemical compound, the particles having a melting point lower than that of the compound in bulk.

18. A method of creating an electrically active pattern, the method comprising the steps of:

a. providing a colloidal suspension of nanoparticles, the nanoparticles exhibiting a desired electrical characteristic and being surrounded by an insulative shell;

b. applying the suspension to a substrate, the applied suspension being substantially insulative owing to the nanoparticle shells;

c. exposing the applied suspension to energy in a desired pattern, the energy removing the shells from the nanoparticles and fusing the nanoparticles together, thereby causing exposed portions of the applied suspension to exhibit the electrical characteristic; and d. drying areas of the applied suspension that have not received energy, the dried areas remaining insulative.

19. A method of creating an electrically active pattern, the method comprising the steps of:

a. providing a colloidal suspension of nanoparticles, the nanoparticles exhibiting a desired electrical characteristic and being surrounded by an insulative shell;

b. applying the suspension to a substrate, the applied suspension being substantially insulative owing to the nanoparticle shells; and c. exposing the applied suspension to energy in a desired pattern, the energy removing the shells from the nanoparticles and fusing the nanoparticles together, thereby causing exposed portions of the applied suspension to exhibit the electrical characteristic, wherein the shells have a surface charge and the substrate has a complementary charge in a pattern thereover, the applying step comprising spreading the particles over the substrate and removing particles not immobilized by the substrate charge.

20. The method of claim 19 wherein the applying and removing steps produce a new layer, and further comprising the step of applying a surface charge to the new layer and repeating the applying, exposing, and removing steps with a new colloidal suspension of nanoparticles.

21. A method of creating an electrically active pattern, the method comprising the steps of:

a. providing a colloidal suspension of nanoparticles, the nanoparticles exhibiting a desired electrical characteristic and being surrounded by an insulative shell;

b. applying the suspension to a substrate, the applied suspension being substantially insulative owing to the nanoparticle shells; and c. exposing the applied suspension to energy in a desired pattern, the energy removing the shells from the nanoparticles and fusing the nanoparticles together, thereby causing exposed portions of the applied suspension to exhibit the electrical characteristic, wherein the energy is in the form of electromagnetic radiation and is provided by exposing the applied suspension to a radiation source through a patterned photomask.

* * * * *